(12) United States Patent
Becker et al.

(10) Patent No.: US 8,099,657 B2
(45) Date of Patent: Jan. 17, 2012

(54) ERROR CORRECTING VITERBI DECODER

(75) Inventors: Christopher J. Becker, Palatine, IL (US); Kevin B. Traylor, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 858 days.

(21) Appl. No.: 12/218,183

(22) Filed: Jul. 11, 2008

(65) Prior Publication Data
US 2010/0011279 A1    Jan. 14, 2010

(51) Int. Cl.
*H03M 13/03*    (2006.01)

(52) U.S. Cl. ........ 714/795; 714/746; 714/752; 714/758; 714/780; 714/786; 714/792; 714/794; 714/796; 714/807; 375/341

(58) Field of Classification Search ........................ None
See application file for complete search history.

(56) References Cited

U.S. PATENT DOCUMENTS

| | | | |
|---|---|---|---|
| 5,577,053 A | 11/1996 | Dent | |
| 5,684,811 A * | 11/1997 | Doran | 714/792 |
| 5,689,532 A * | 11/1997 | Fitzpatrick | 375/341 |
| 6,597,743 B1 * | 7/2003 | Khayrallah et al. | 375/265 |
| 6,742,158 B2 | 5/2004 | Singvall | |
| 7,298,798 B1 * | 11/2007 | Chao et al. | 375/341 |
| 7,805,664 B1 * | 9/2010 | Yang et al. | 714/794 |
| 2008/0008272 A1 * | 1/2008 | Yang et al. | 375/341 |
| 2010/0269026 A1 * | 10/2010 | Yang et al. | 714/792 |
| 2011/0019724 A1 * | 1/2011 | Agazzi | 375/219 |

* cited by examiner

*Primary Examiner* — John Trimmings

(57) ABSTRACT

Methods and corresponding systems in a Viterbi decoder include selecting an input symbol in an input block, wherein the input block has a plurality of input symbols, wherein each input symbol has a Boolean value, a quality value, and an associated stage, and wherein the selected symbol is selected based upon the quality value of the selected symbol relative to a quality value of other input symbols in the input block. Thereafter, the Boolean value of the selected symbol is complemented to produce a complemented symbol. The complemented symbol is substituted for the selected symbol to produce an alternate input block. A Viterbi algorithm is executed using the alternate input block to produce an alternate decoded bit sequence, which is then checked for errors using an error check. The alternate decoded bit sequence is output in response to the alternate decoded bit sequence passing the error check.

20 Claims, 4 Drawing Sheets

ERROR CORRECTING VITERBI DECODER

BACKGROUND

1. Field

This disclosure relates generally to a decoder in a communication system, and more specifically to a Viterbi decoder having error correction and corresponding methods therein.

2. Related Art

Many data processing systems receive and process data, so it is desirable to increase performance in the error-free reception of data. Convolutional coding is a technique that can be used to reduce the error rate in transferring or transmitting digital data. A convolutional code is a type of error-correcting code, wherein a block of data set for transmission can be encoded prior to transmission, and then decoded after reception. In one example, an encoder may have an input that receives one bit and outputs three encoded bits, in which case a "rate" of the encoder is ⅓ (i.e., one bit in produces three bits out). In a rate one encoder, the encoder receives one bit in and produces one bit out.

Every bit output from the convolutional encoder is a function of the previous k bits input, wherein "k" can be referred to as the constraint length of the code. For example, if k=3, then every bit, or bits, output by the encoder is a function of the current and previous 2 input bits.

To provide a method for error detection, "message data" (i.e., the data bits that will be transmitted from transmission in the transmitting end) can be associated with, or accompanied by, additional data that can be used at the receiving end to detect an error. One known type of error detection is a cyclic redundancy check (CRC). Prior to transmission, the message data portion of the data block can be analyzed to calculate an additional field of data, which can be referred to as a CRC. Upon reception in the receiver, a CRC can also be calculated based on the received message data. The CRC calculated in the receiver is then compared to the CRC in the received data. If the calculated CRC matches the received CRC, the message data block can be deemed correct.

A Viterbi decoder is a type of data decoder that can be used in a receiver, or other data processor, to decode a bitstream that has been convolutionally encoded. The Viterbi algorithm in the decoder performs a maximum likelihood decoding algorithm to identify a statistically most likely sequence of data, which can be depicted as a statistically most likely path through a decoder trellis diagram. A Viterbi decoder can be used in decoding convolutional codes in devices such as satellite communication systems, telephone-line modems, computer storage devices such as hard disk drives, and other similar devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
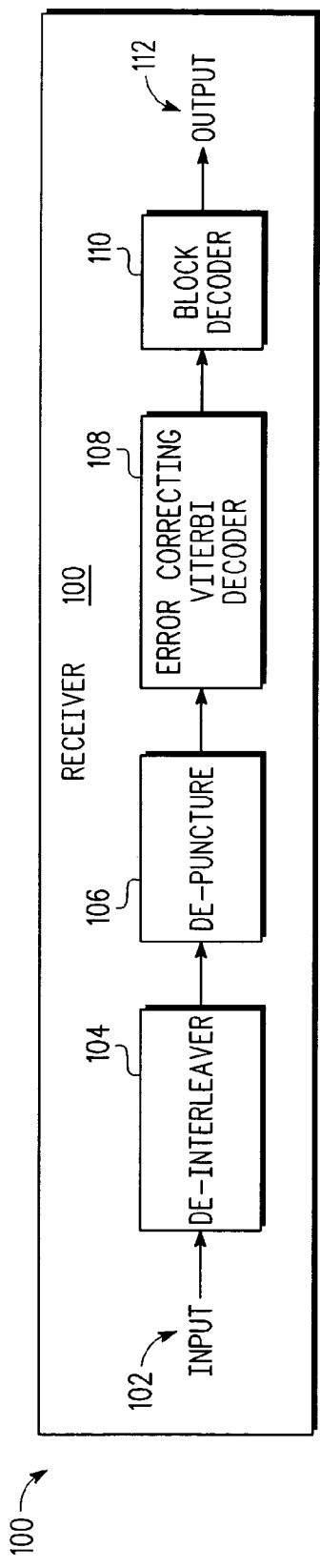
FIG. 1 is a high-level block diagram of a communication system, or a data processing system, that receives and decodes encoded data in accordance with one or more embodiments.

Referring to FIG. 1, there is depicted a high-level block diagram of a receiver, which can be used in a communication system, or a data processing system, to receive and decode encoded data in accordance with one or more embodiments. Receiver 100 can be any device or data processor that receives a stream of convolutionaly encoded channel symbols (e.g., input data 102), which can be decoded with a Viterbi decoder. The encoded channel symbols are transmitted through a channel, which may be wireless, or in a wire, or in another medium that can be affected by noise that can cause a transmission error. For example, receiver 100 can be used in a wireless subscriber unit in a mobile wireless communication system, or in a telephone-line modem, or in a circuit for decoding data read from the media in a mass storage unit, such as a disk drive, or CD, or DVD reader.

In the embodiment of FIG. 1, input data 102 can be pre-processed as needed before decoding, depending upon the various processes performed upon the data prior to convolutional encoding. For example, input data 102 can first be processed by de-interleaver 104, which can reorder the data that has been interleaved at the transmitter (or other data source). Following de-interleaver 104, de-puncture function 106 can add erasure bits back into a punctured data stream to allow the decoder to work at the proper rate.

The output of de-puncture function 106 can be input into error correcting Viterbi decoder 108. In one embodiment, error correcting Viterbi decoder 108 computes a most likely sequence of received channel symbols and performs an error check on a decoded bit sequence corresponding to such a sequence of channel symbols. If the error check passes, error correcting Viterbi decoder 108 can output (e.g., pass to the next data processing function) a decoded bit sequence (i.e., decoded bits) corresponding to the most likely sequence of received channel symbols. If the error check fails, error correcting Viterbi decoder 108 can attempt to create and find an alternate sequence of decoded bits that will pass the error check. If such a "passing" sequence (i.e., an alternate decoded bit sequence) is found, error correcting Viterbi decoder 108 can output the alternate decoded bit sequence corresponding to the alternate sequence of channel symbols.

For example, the decoded bit sequence output by error correcting Viterbi decoder 108 can be passed to block decoder 110. Block decoder 110 can be used to convert decoded bits into message bits (e.g., output 112), where such message bits represent the actual data message, or data "payload" from the transmitter, or other data source.

Figure 2:
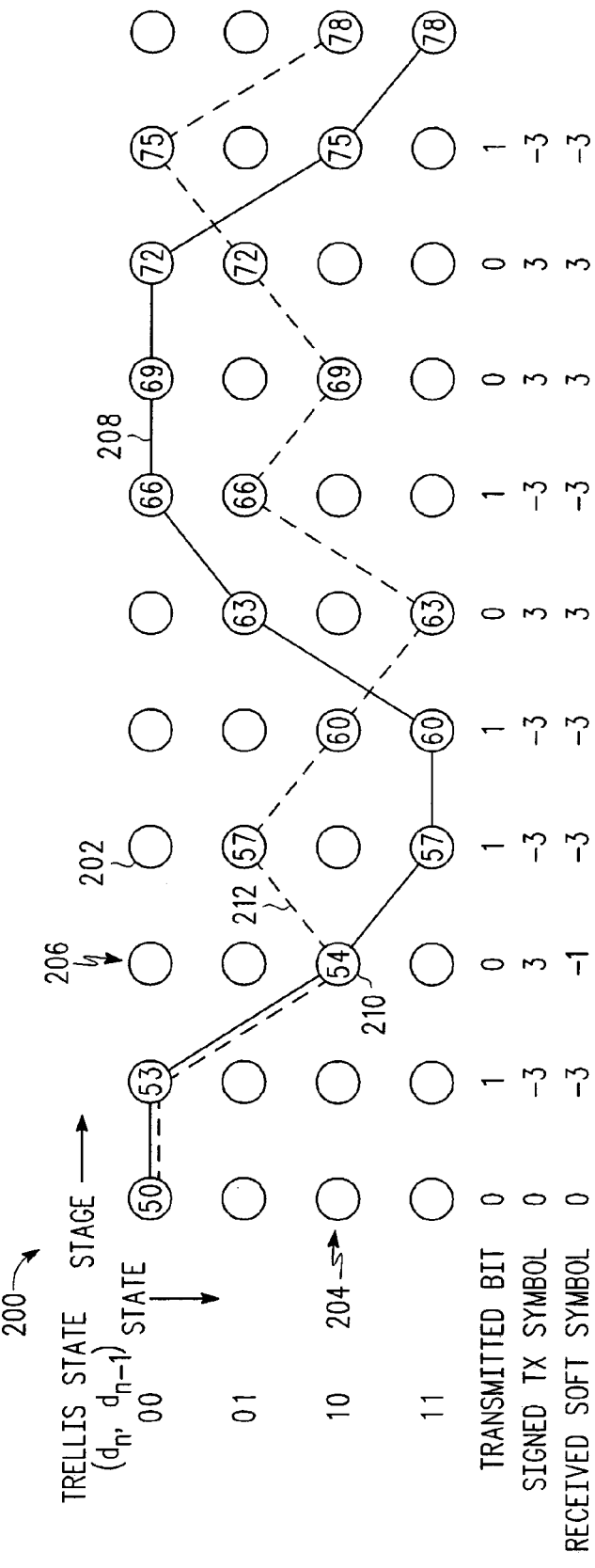
FIG. 2 is a trellis diagram used for decoding in accordance with one or more embodiments.

Referring now to FIG. 2, there is depicted a diagram of a Viterbi trellis 200 in accordance with one or more embodiments. As shown, Viterbi trellis 200 is a decoder trellis that can be used as a structure, or a graphical means, for organizing the decoding of convolutionally encoded data. Viterbi trellis 200 is comprised of a plurality of nodes 202 (e.g., circles) arranged in rows and columns. Each row of nodes in the trellis, such as row 204, corresponds to one of a plurality of possible states of the encoder. Each column in the trellis, such as column 206, corresponds to a stage in the decoding process, where the stages can also correspond to a time in the decoding process. At each stage, there are $2^{k-1}$ states in the trellis, where "k" is the constraint length of the code. For the example shown in FIG. 2, k would be equal to 3, which would produce 4 states. In another embodiment, an encoder using a constraint length of k=7 can be used, which would use a trellis diagram having 64 states.

A line (typically referred to as a branch) connecting a node in one stage to a node in the next stage can graphically represent a state transition that occurs based on the reception of a code word. A sequence of state transitions (or branches) through the trellis can be referred to as a "path," wherein the path represents a corresponding sequence of received channel symbols, which in turn corresponds to a sequence of bits input into the encoder.

When decoding a stream of rate one symbols, the Viterbi algorithm can be simplified so that it only considers two paths extending from one state in each stage in the trellis diagram. With rate one data coding, one of the two branches exiting each state of each stage will be the maximum (i.e., highest quality) for that stage. Because of the state metric initialization of the known state (e.g., the metric is initialized to a value of 50 at state 00) at stage 0, the best state at stage $s_j$ must be reached by a path that goes through the best state of all previous stages. Therefore, the Viterbi decoder only needs to evaluate the possible paths that originate from the best state of each stage, not all states at each stage. This results in a sizable reduction in computations and memory storage requirements.

The basis of the Viterbi decoding algorithm is the following observation: if any two paths in the trellis merge into a single node, one of the paths can always be eliminated in the search for the optimum path. The Viterbi algorithm involves calculating a measure of similarity, or a measure of distance, or a measure of quality, between the received channel symbols, at stage $s_i$, and all possible received channel symbols associated with trellis paths entering each state at stage $s_i$.

Thus, in Viterbi trellis 200 two paths can lead to a given node, but only one can be the most likely path to that node, i.e., the path with the best metric. The most likely path to a node is called the "surviving path," and the path that is not the most likely path to that node is called the "non-surviving path" because it can be eliminated as a candidate in the search for the most likely path through Viterbi trellis 200.

After executing the Viterbi algorithm, the most likely path (i.e., the ML path) through the Viterbi trellis can be represented as ML path 208, which is shown in FIG. 2 with a solid line. Note that in many applications, Viterbi trellis 200 can have many more states and many more stages. Therefore, Viterbi trellis 200 can represent only a portion of a relatively small trellis. For example, Viterbi decoders for decoding an input block having 190 bits of data can include 64 states in 196 stages. In many embodiments, extra stages can be included for flushing the encoder memory. In this example, there can be one bit per stage, and, if k=7, six additional bits can be used to flush (i.e., reset to zero) the encoder stages.

When a non-surviving path is eliminated in the trellis, the decision can be based upon accumulated branch metrics that measure the "distance" between the combinations of channel symbols received and all of the possible channel symbol combinations that could have been received. In one embodiment, the distance measurement is a Hamming distance, which is a distance computed by simply counting how many bits are different between the received channel symbol and the possible channel symbols. The Hamming distance (or other metric that may be used) that is computed at each transition between stages can be called branch metrics. Path metrics can be calculated by accumulating the branch metrics over the series of transitions, or branches, that form the path.

In FIG. 2, nodes, such as node 202, along ML path 208 illustrate the accumulation of path metrics for the various stages. At the left side of Viterbi trellis 200, the path metric at state 00 is initialized with a value of 50. At each subsequent stage from left to right, the path metric is increased by the absolute value of the quality value of the received symbol, as indicated along the bottom row figures below the trellis. In the example shown in FIG. 2, a three-bit soft symbol is used. Soft symbols are described more completely below. At node 210, a symbol with an error is received, as indicated below the trellis by the difference in the transmitted symbol and the received symbol (e.g., 3 compared to −1). If the correct value, or another value, had been received at node 210, the decoder may have output an alternate decoded bit sequence corresponding to alternate path 212.

Figure 3:
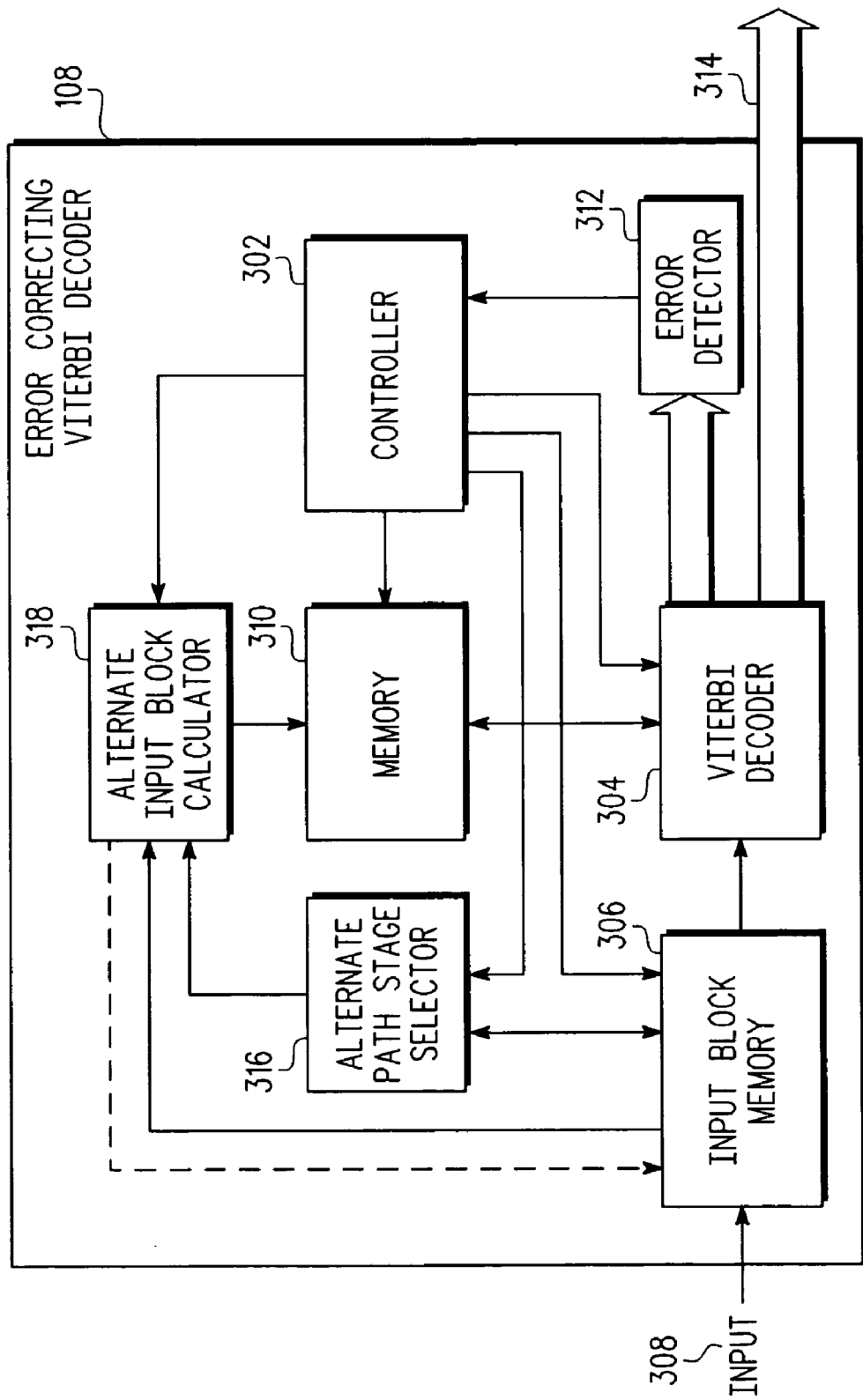
FIG. 3 is a high-level block diagram of an error correcting Viterbi decoder in accordance with one or more embodiments.

Referring now to FIG. 3, there is depicted a more detailed block diagram of error correcting Viterbi decoder 108 in accordance with one or more embodiments. As shown, error correcting Viterbi decoder 108 can include controller 302, which can be used to control and synchronize the operation of various other functional blocks. For example, controller 302 can be coupled to Viterbi decoder 304 and input block memory 306 for controlling the execution of a Viterbi decoding algorithm using data (e.g., input symbols) stored in input block memory 306.

In one embodiment, controller 302 can be implemented in hardware, or firmware, with a state machine, or logic circuit. In another embodiment, controller 306 can be implemented with a microcontroller that executes appropriate microcode. In yet another embodiment, controller 302 to be implemented with various combinations of hardware, firmware, and software.

Input block memory 306 can be used to store a block of channel symbols (or input symbols) 308, wherein channel symbols 308 represent a block of encoded data that has been received for decoding. In some embodiments, channel symbols 308 can be pre-processed by de-interleaver 104 and de-puncture function 106, as shown in FIG. 1. Input block memory 306 can receive, or buffer, input symbols 308, and then output the buffered input symbols to Viterbi decoder 304, as needed, for one or more block decoding operations according to control signals from controller 302.

Viterbi decoder 304, which is generally known, can be used to execute a Viterbi algorithm to decode a block of input symbols. Viterbi decoder 304 can include internal memory registers and logic circuits for storing data structures, and for storing and calculating branch and path metrics associated with various nodes in a Viterbi trellis (e.g., Viterbi trellis 200). Additionally, memory 310 can be coupled to Viterbi decoder 304 for storing data associated with various paths through Viterbi trellis 200, such as ML path 208 or alternate path 212 in FIG. 2.

An output of Viterbi decoder 304 can be coupled to error detector 312 for transferring a decoded bit sequence so that it can be checked by an error checking function or operation. In one embodiment, error detector 312 can perform a cyclic redundancy check (CRC) type of error detection function, wherein the decoded bit sequence can include a plurality of bits in a cyclic redundancy check (CRC) field. Error detector 312 can calculate a CRC based on decoded bits in a message field, and compare the computed CRC to the received CRC from the CRC field. If the computed CRC matches the received CRC, then the decoded bits can be deemed correct, or error free. However, if the computed CRC does not match the received CRC, then the decoded bit sequence can be deemed erroneous, corrupt, or otherwise decoded incorrectly.

Error detector 312 can be coupled to controller 302 in order to communicate the error condition or status of the decoded bit sequence.

In response to an indication that a selected decoded bit sequence has passed an error check in error detector 312, controller 302 can send a control signal to Viterbi decoder 304 to instruct it to output the selected decoded bit sequence at output 314.

If a decoded bit sequence does not pass the error check, error correcting Viterbi decoder 108 can attempt to find an alternate decoded bit sequence that will pass the error check. In order to find such a passing alternate decoded bit sequence, alternate path stage selector 316 can be used to select a "selected symbol" from the plurality of input symbols in the input block, which input symbols can be stored in input block memory 306. Each input symbol in the plurality of input symbols can include a Boolean value and a quality value. If a rate one encoder was used, the Boolean value can be a single bit. Additionally, each symbol can be associated with a selected stage of the Viterbi decoder algorithm, wherein the number of stages corresponds to a number of bits in a decoded bit sequence, and an added number of bits (e.g., "tail bits") that can be used to flush, or reset, the decoder. The combination of the Boolean value and the quality value can be referred to as a "soft symbol." In one embodiment, a soft symbol can be represented by a plurality of bits, wherein one of the bits represents the Boolean value, and the remaining bits can represent the quality of the symbol. The quality of the symbol can represent a level of confidence, or a statistical probability, of receiving the associated Boolean value. Table 1, below, is an example of a set of 3-bit two's complement soft symbols.

In one embodiment, such as the embodiment of FIG. 2, the Boolean value of the symbol can be indicated by the sign of the symbol, and the quality value can be indicated by a value ranging from 0 to 3.

The selected symbol can be selected based upon the quality value of the selected symbol relative to, or compared to, the other quality values of the other input symbols in the input block. In one embodiment, the selected symbol from alternate path stage selector 316 can have a lowest quality value of the plurality of input symbols in the input block. At node 210 in FIG. 2 there is an example of an erroneously received symbol. The signed transmitted symbol had a value of 3, while the received soft symbol has a value of −1, which is a lowest quality of all the symbols. In other embodiments, more than one symbol can be selected. If N input symbols are selected, wherein N is an integer greater than one, the N input symbols can be selected based on the quality values of the N input symbols relative to the quality values of other input symbols in the input block.

TABLE 1

| SOFT SYMBOL | BOOLEAN VALUE | QUALITY VALUE |
| --- | --- | --- |
| 011 | 0 | STRONGEST |
| 010 | 0 | STRONG |
| 001 | 0 | WEAK |
| 000 | 0 | WEAKEST |
| 111 | 1 | WEAKEST |
| 110 | 1 | WEAK |
| 101 | 1 | STRONG |
| 100 | 1 | STRONGEST |

For example, as the input symbols are scanned, N symbols can be selected from the lowest quality end of a rank ordered list of the plurality of input symbols. In another embodiment, the N input symbols can be selected based upon a threshold quality value, wherein the quality of each of the N selected input symbols is less than or equal to a threshold quality value, or less than or equal to an $N^{th}$ smallest quality value of a range of quality values in the plurality of input symbols. Thus, in some cases, some or all of the quality values can be the same. In some cases, none of the quality values may be equal to the Nth smallest quality value, and in all cases, none of the quality values will be greater than the Nth smallest quality value. In one embodiment, N can be 5. In other embodiments, the value of N can be based upon the number of Viterbi decoding operations that can be performed before the decoder must begin decoding the next input block of input symbols. If the Viterbi decoder is operating on input symbols encoded with a rate one encoder, there may be time to perform five or more (e.g., 32, which is $2^N-1$) Viterbi decoding operations using Viterbi decoder 304.

An analysis of the received symbols (i.e., input symbols) in FIG. 2 shows that the input symbol associated with node 210 has a low, or lowest, quality of the plurality of input symbols. As shown, node 210 has a quality value with an absolute value of 1 compared to all other symbols that have an absolute value of 3. Thus, the input symbol associated with node 210 can be an input symbol selected by alternate path stage selector 316 because it has a lowest associated quality value of the plurality of input symbols.

Alternate path stage selector 316 can be coupled to input block memory 306 for reading and analyzing input symbols. Alternate path stage selector 316 can be coupled to controller 302 for receiving a control signal that can initiate and control the process of selecting one or more selected symbols in input block memory 306 based upon specified criteria of symbol quality values.

An output of alternate path stage selector 316 can be coupled to alternate input block calculator 318 for transferring data regarding the one or more selected input symbols. Alternate input block calculator 318 can be used for calculating an alternate input block of input symbols based upon the selected symbols. In one embodiment, alternate input block calculator 318 can complement, or change, the Boolean value of the selected symbol to produce a complemented symbol. The complemented symbol can then be substituted for the selected symbol, at the stage of the selected symbol, to produce an alternate input block. Thus the alternate input block is an input block with different input symbols.

If N input symbols have been selected, alternate input block calculator 318 can produce up to $2^N-1$ alternate input blocks by substituting Boolean combinations of the N complemented input symbols for corresponding ones of the N selected symbols at corresponding stages. For example, if 2 input symbols are selected (e.g., when N=2), alternate input block calculator 318 can produce three alternate input blocks, including: a first alternate input block produced by substituting the first complemented symbol, a second alternate input block produced by substituting the second complemented symbol, and a third alternate input block produced by substituting both the first and the second complemented symbols.

Alternate input block calculator 318 can be coupled to controller 302 for receiving control signals to invoke, or control, the processes of complementing the Boolean values of the selected input symbols, and selectively substituting such complemented symbols to produce alternate input blocks. Alternate input block calculator 318 can be coupled to alternate path stage selector 316 for receiving data regarding selected symbols. Alternate input block calculator 318 can be coupled to input block memory 306 for reading or receiving input symbols for producing one or more alternate input blocks. Alternate input block calculator 318 can also use memory 310 to store alternate input blocks.

In another embodiment, alternate input block calculator 318 can be coupled to memory 306 (shown with a dashed line) for sending signals to modify selected symbols output by input block memory 306 on the fly (e.g. complement the Boolean value of a selected input symbol as it is being recalled and output from input block memory 306 into Viterbi decoder 304). In this embodiment, an alternate input block can be calculated on the fly, rather than being calculated in advance and stored in memory, such as memory 310.

In one embodiment, controller 302, Viterbi decoder 304, input block memory 306, memory 310, error detector 312, alternate path stage selector 316, and alternate input block calculator 318 can all be implemented in hardware, using various memory cells, computational logic, and other state machine logic circuits. In some embodiments, firmware may be used to control various state machines. In another embodiment, some of these functional blocks can be implemented in software, or some combination of hardware and software, where an appropriate microcontroller or other data processor executes software or microcode. A software implementation can provide increased flexibility in changing functionality and parameters.

Figure 4:
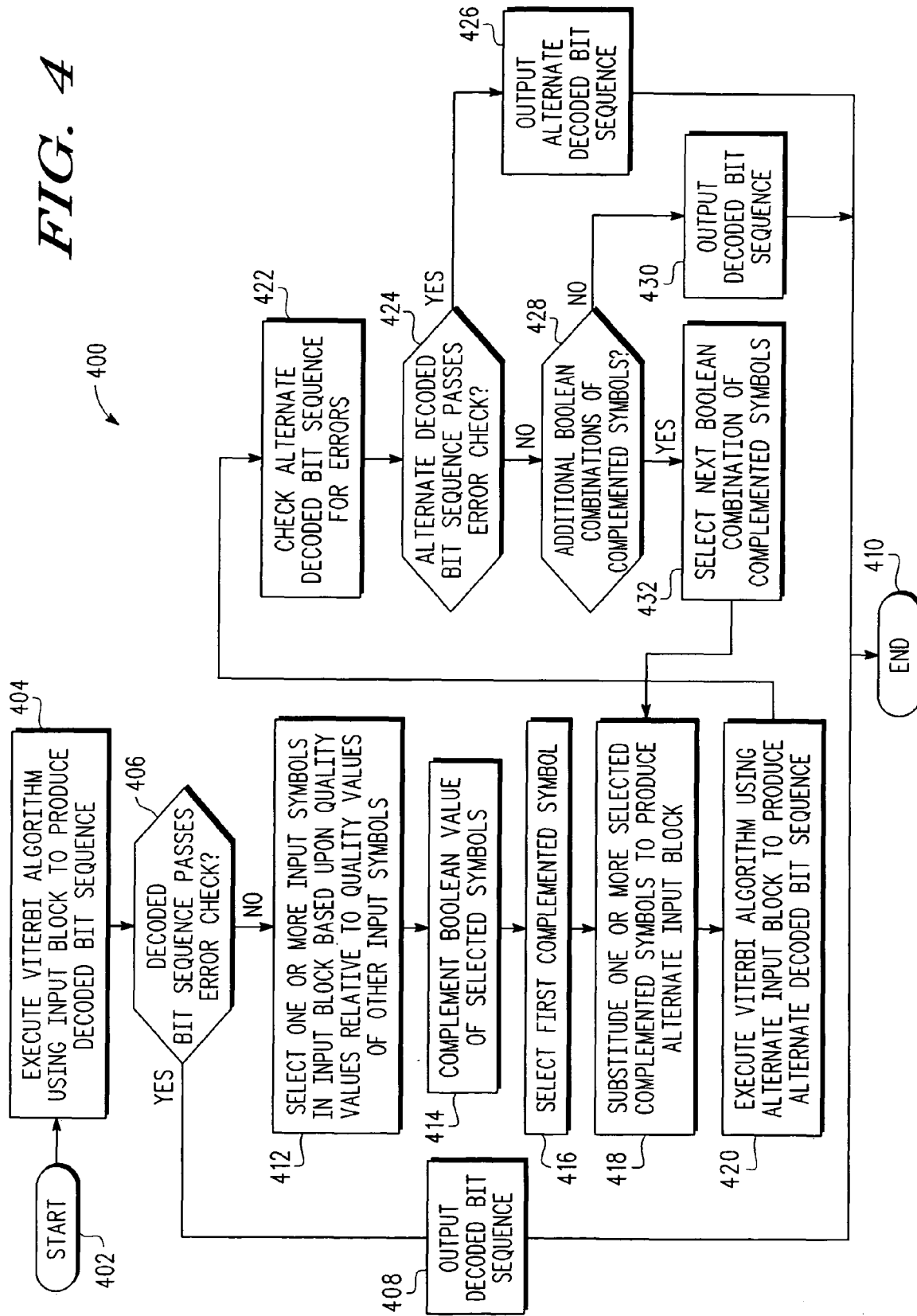
FIG. 4 is a high-level flowchart of one or more processes that can be implemented in an error correcting Viterbi decoder, e.g., as shown in FIG. 1, in accordance with one or more embodiments.

Referring now to FIG. 4, there is depicted a high-level flowchart 400 of one or more processes that can be executed by error correcting Viterbi decoder 108, or another similar circuit with appropriate functionality, in accordance with the one or more embodiments. As shown, flowchart 400 begins at 402, and thereafter passes to 404, wherein the process performs a Viterbi algorithm using a first input block of channel symbols to compute a most likely (ML) path in the Viterbi trellis. In one embodiment, the channel symbols can be input into Viterbi decoder 304 from input block memory 306 in response to control signals from controller 302 (see FIG. 3). Executing the Viterbi algorithm can include all the processes and calculations needed to input a block of channel symbol data, and, in response, output a decoded bit sequence that corresponds to a most likely path through the Viterbi trellis.

After computing the ML path and the decoded bit sequence represented by the ML path, the process determines whether the decoded bit sequence passes an error check, as illustrated at 406. In one embodiment, a decoded data block (i.e., a decoded bit sequence) can have a message portion, or field, and an error check portion, or field. Data in the error check portion can include a received cyclic redundancy check (CRC) value, which can be compared to a CRC value calculated from the decoded data in the message portion. In another embodiment, another error checking scheme can be used, such as a block code, or another error detecting code.

In an embodiment using a CRC error checking scheme, if the calculated CRC matches the received CRC, the ML path passes the error check, and the process can pass to 408, wherein the process outputs a decoded bit sequence (i.e., decoded bits) represented by the ML path. The decoded bit sequence can, in some embodiments, be out put to, for example, block decoder 110 for further processing.

After outputting the decoded bit sequence, the process of decoding a block of encoded data ends at 410. In many embodiments, the processes depicted in flowchart 400 can be iteratively repeated for each received data block. For example, if the received data block represents encoded speech data, the processes depicted in flowchart 400 can be iteratively repeated as speech data is streamed to receiver 100 (see FIG. 1), which receiver can include error correcting Viterbi decoder 108.

If, at 406, the decoded bit sequence represented by the ML path fails the error check, the process can select one or more input symbols in the input block based upon the quality values of the input signals relative to the quality values of all the other input symbols in the input block, as depicted at 412. If one input symbol is selected, the symbol can be the symbol with the least, or smallest, quality value, or one of the input symbols with the least quality value. If more than one input symbols are selected, each of N number of selected input symbols can have a quality value that is less than or equal to the $N^{th}$ smallest quality value. In some instances, some of all of the N input symbols can have the same quality value, which is equal to the least quality value of all input symbols in the input block.

In some embodiments, the N input symbols can be selected by comparing the plurality of input symbols to a threshold quality value. In another embodiment, the process can sort or rank order the input symbols in the input block to identify the one input symbol, or the N number of input symbols, with the weakest or lowest quality values. After ranking the quality values, the process can select N number of input symbols at a lowest quality level end of a rank-ordered list of the plurality of input symbols.

In this selection step 412, the process identifies one or more stages in the Viterbi trellis in which the reception and the subsequent interpretation or evaluation of a received signal is more likely to be in error, resulting in one or more erroneous input symbols, which will produce a decoding error. Node 210 in FIG. 2 corresponds to a selected symbol having a lowest quality value, which can indicate that the selected symbol is more likely to be in error. In one embodiment, the selection of the one or more input symbols can be implemented using alternate path state selector 316, as shown in FIG. 3 and described above.

In various embodiments, the quality of an input symbol can be represented by a binary value using a few bits in the soft symbol representation. When a three bit soft symbol is used, the Boolean value and the quality value of the soft symbol can be implemented as shown in Table 1, above.

Once the one or more input symbols have been selected, the process complements the Boolean values of the one or more selected input symbols to produce corresponding complemented symbols, as depicted at 414. Complementing a symbol can be implemented by changing the Boolean value of the selected input symbol from a 0 to a 1, or from a 1 to a 0. Some embodiments may change a −1 to a 1, and a 1 to a −1, depending upon the convention used to represent input symbols.

Next, the process can select the first complemented symbol, as illustrated at 416. At 418, the process substitutes the first complemented symbol (or, in subsequent passes through the flowchart, substitutes another selected complemented symbol or combinations of complemented symbols) for a respective selected symbol or symbols in the input block to produce an alternate input block.

Substituting complemented symbols can be implemented with alternate input block calculator 318, which can receive input symbols from input block memory 306, and can receive data related to selected symbols from alternate path stage selector 316. With this data, alternate input block calculator 318 can calculate the alternate input block and store it in memory 310, where the alternate input block symbols can be accessed by Viterbi decoder 304. In another embodiment, alternate input block calculator can be coupled to input memory block 306 to provide instructions that causes input memory block 306 to selectively complement the Boolean values of selected symbols of the plurality of input symbols (i.e., modify selected symbols as they are recalled, or "on-the-fly") as they are transferred from input memory block 306 to Viterbi decoder 304.

In FIG. 2, node 210 can correspond to a selected symbol. Alternate path 212, which is shown with a dashed line, can represent an alternate path through Viterbi trellis 200, where alternate path 212 deviates from ML path 208 because a Boolean value of a selected symbol was complemented. Because alternate path 212 is different from ML path 208, the decoded bit sequence that is output is also different.

After decoding the alternate input block, the process determines whether the alternate decoded bit sequence passes the error check, as depicted at 422. If the alternate decoded bit sequence passes, the process passes to 426, wherein the alternate decoded bit sequence is output. Thereafter, the process of decoding and correcting errors in a block of input symbols terminates, as indicated at 410.

In one embodiment, checking the alternate decoded bit sequence for errors can be implemented with error detector 312, as shown in FIG. 2. Error detector can use a CRC-type error detection algorithm wherein a CRC portion of the alternate decoded bit sequence is compared to a CRC computed from a message portion of the alternate decoded bit sequence. In other embodiments, other error detection techniques can be used, such as a block code technique, or suitable similar techniques.

If, at 424, the alternate decoded bit sequence does not pass the error check, the process passes to 428, wherein the process determines whether there are additional Boolean combinations of complemented symbols that can be used to create additional alternate input blocks. If all Boolean combinations of complemented symbols have been used, and none of the corresponding alternate decoded bit sequences pass the error check, the process can output the decoded bit sequence based on the ML path that was produced at 404, even though it is erroneous. The process can also flag the output to indicate an error. In other embodiments, the process may merely output an indication of an error which can cause a request for retransmission of the block, or other similar output or error-handling routine. Or, the process can output another predetermined decoded bit sequence.

At 428, if there are additional combinations of complemented symbols to consider, the process can select a next combination of complemented symbols, as depicted at 432. Thereafter, the process can iteratively pass to 418, wherein a new alternate input block can be produced for decoding at 420 and testing at 422. The processing loop that passes through 418, 420, 422, 424, 428, and 432 can continue until a passing alternate decoded bit sequence is found, or until all alternate decoded bit sequences have been checked for an error.

Figure 5:
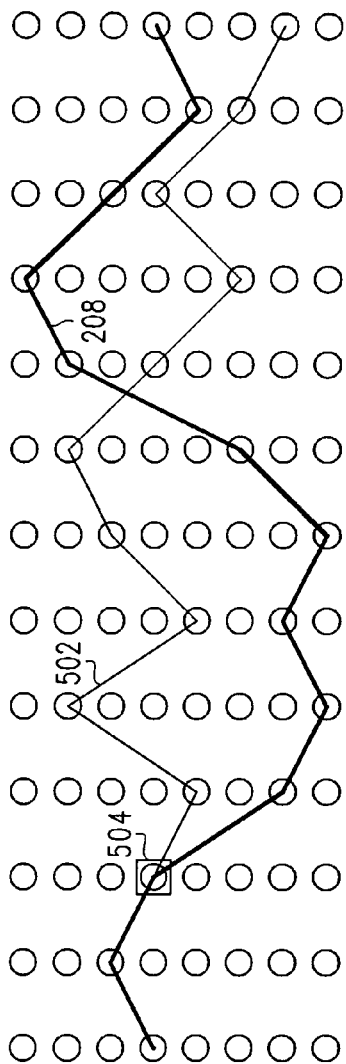
FIGS. 5, 6, and 7 are trellis diagrams that show alternate paths in accordance with one or more embodiments.
Figure 6:
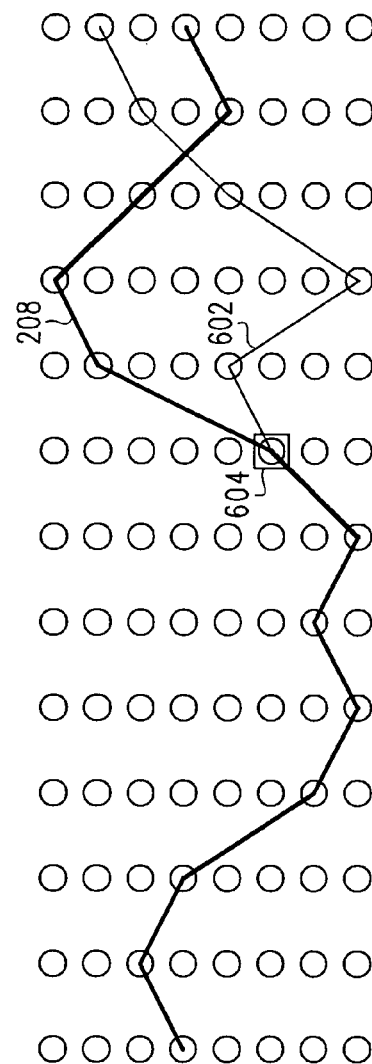
Figure 7:
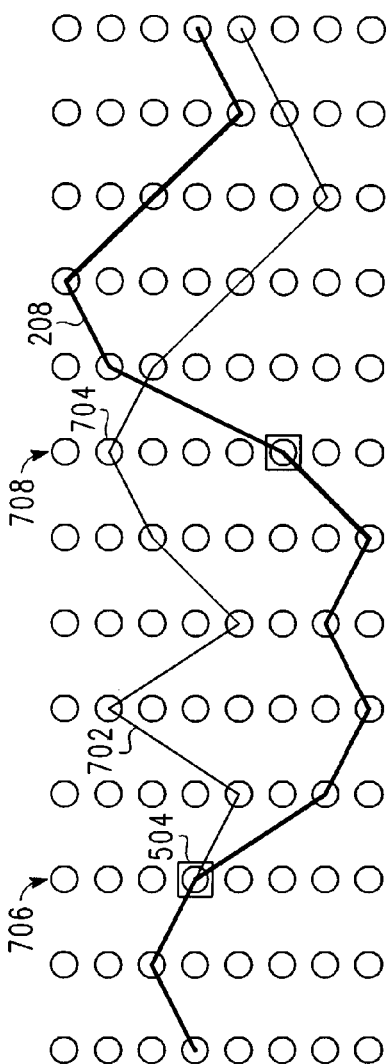

Additional combinations of complemented symbols can be created using alternate input block calculator 418. The combinations can include all Boolean combinations of complemented symbols, which can be used to make $2^N-1$ alternate input blocks by substituting complemented symbols individually, and in all possible combinations. FIGS. 5 through 7 illustrate examples of 3 alternate paths through Viterbi trellis 200 compared to ML path 208. In FIG. 5, first alternate path 502 (shown with a thin line) deviates from ML path 208 (shown with a thick line) at node 504. Node 504 corresponds to a first selected symbol that has been complemented and substituted to produce a first alternate input block. Decoding the first alternate input block produces first alternate path 502. In FIG. 6, alternate path 602 deviates from ML path 208 at node 604. Node 604 corresponds to a second selected symbol that has been complemented and substituted to produce a second alternate input block. Decoding the second alternate input block produces second alternate path 602. In FIG. 7, third alternate path 702 deviates from ML path 208 at node 504. Third alternate path 702 looks like first alternate path 502 up until node 704. Third alternate path 702 deviates from first alternate path 502 at node 704 because third alternate path 702 is a result of decoding a third alternate input block that has two complemented symbols substituted for two selected symbols at stages 706 and 708.

If, at 428, there are no additional alternate paths for consideration, the process can output, at 430, decoded bits associated with ML path 210, and then pass to 410 wherein the process of decoding and error-correcting an encoded data block ends. Alternatively, the process can output another predetermined decoded bit sequence. When data is output at 430, the data can be flagged to indicate there is an error, which can cause an error handler (not shown) in receiver 100 to ignore the data, or to send a request to re-transmit the data, depending upon the importance of the data, and the time required to retransmit the data, and other considerations for handling an erroneously decoded data block.

The techniques of decoding and error-correcting a block of encoded data described above work best when there is time to process several Viterbi algorithms to check several alternate input blocks. There can be time to execute more Viterbi algorithms if a rate one code is used in the encoding and decoding because a Viterbi decoding algorithm for a rate one code requires fewer calculations and less data access and overall storage. Alternatively, higher speed data processors can enable the execution of more Viterbi algorithms for checking more.

Another advantage is that a communication system using rate one coding can continue to use rate one coding as long as the input symbol errors can be corrected by error correcting Viterbi decoder 108. Rate one coding is desirable because it allows for a higher data throughput with all other transmission constraints held constant, such as bandwidth, modulation, etc. . . .

Although the invention is described herein with reference to specific embodiments, various modifications and changes can be made without departing from the scope of the present invention as set forth in the claims below. For example, while the techniques and apparatus for decoding and performing error correcting techniques on an encoded data block may vary widely, one or more embodiments can be used in signal processing or communication systems applications. For example, the decoding and error correcting techniques set forth herein can be used in a wireless receiver (e.g., a cellular telephone or other wireless subscriber unit), a set-top cable TV decoder, a mass storage medium data decoder e.g., a disk drive, or DVD or CD reader), or the like. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or an essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method in a Viterbi decoder comprising:
   selecting an input symbol in an input block to provide a selected symbol, wherein the input block has a plurality of input symbols, wherein each input symbol has a Boolean value, a quality value, and an associated stage, and wherein the selected symbol is selected based upon the quality value of the selected symbol relative to a quality value of other input symbols in the input block;

complementing the Boolean value of the selected symbol to produce a complemented symbol;

substituting the complemented symbol for the selected symbol at the associated stage of the selected symbol to produce an alternate input block;

executing a Viterbi algorithm using the alternate input block to produce an alternate decoded bit sequence;

checking the alternate decoded bit sequence for errors using an error check; and outputting the alternate decoded bit sequence in response to the alternate decoded bit sequence passing the error check.

2. The method in a Viterbi decoder according to claim 1 wherein the selecting the input symbol comprises selecting an input symbol having a quality value equal to a lowest quality value of the plurality of input symbols in the input block.

3. The method in a Viterbi decoder according to claim 1 wherein the complementing the Boolean value of the selected symbol comprises changing the Boolean value of the selected symbol while maintaining an absolute value of the quality value of the selected symbol.

4. The method in a Viterbi decoder according to claim 1 wherein the checking the alternate decoded bit sequence for errors comprises checking the alternate decoded bit sequence for errors using a cyclic redundancy check (CRC) type error check, wherein a CRC value computed on a first portion of the alternate decoded bit sequence is compared to a CRC value contained in a second portion of the alternate decoded bit sequence.

5. The method in a Viterbi decoder according to claim 1 wherein the plurality of input symbols comprises a plurality of input symbols produced with a rate one encoder.

6. The method in a Viterbi decoder according to claim 1 wherein the selecting the input symbol and the complementing the Boolean value comprises:

selecting N input symbols in the input block to provide N selected symbols, the selecting based upon the quality value of each of the N selected symbols relative to the quality value of other input symbols in the input block, wherein N is an integer greater than one; and complementing the Boolean value of each of the N selected symbols to produce N complemented symbols.

7. The method in a Viterbi decoder according to claim 6 wherein the quality value of each of the N selected symbols is less than or equal to an Nth smallest quality value of the quality value of each of the plurality of input symbols.

8. The method in a Viterbi decoder according to claim 6 wherein the substituting the complemented symbol comprises substituting a Boolean combination of the N complemented symbols for corresponding ones of the N selected symbols at corresponding stages to produce one or more of $2^N-1$ possible alternate input blocks.

9. A Viterbi decoder comprising:

a controller;

an alternate path stage selector coupled to the controller, wherein the alternate path stage selector selects a selected symbol in an input block, wherein the input block has a plurality of input symbols, wherein each input symbol has a Boolean value, a quality value, and an associated stage, and wherein the selected symbol is selected based upon the quality value of the selected symbol relative to a quality value of other input symbols in the input block;

alternate input block calculator coupled to the controller, wherein the alternate input block calculator calculates an alternate input block by complementing the Boolean value of the selected symbol to produce a complemented symbol, and substituting the complemented symbol for the selected symbol to produce an alternate input block;

a Viterbi decoder coupled to the controller for decoding the alternate input block to produce an alternate decoded bit sequence, and for outputting the alternate decoded bit sequence; and an error detector coupled to the controller for detecting an error in the alternate decoded bit sequence.

10. The Viterbi decoder according to claim 9 wherein the alternate path stage selector comprises an alternate path stage selector for selecting an input symbol having a quality value equal to a lowest quality value of the plurality of input symbols.

11. The Viterbi decoder according to claim 9 wherein the error detector comprises an error detector for detecting an error using a CRC type error check.

12. The Viterbi decoder according to claim 9 wherein the plurality of input symbols comprises a plurality of input symbols encoded with a rate one encoder.

13. The Viterbi decoder according to claim 9 wherein the alternate path stage selector comprises an alternate path stage selector for providing N selected symbols based upon the quality value of each of the N selected symbols relative to the quality value of other input symbols in the input block, wherein N is an integer greater than one.

14. The Viterbi decoder according to claim 13 wherein the alternate path stage selector comprises an alternate path stage selector for providing N selected symbols, wherein each of the N selected symbols has a quality value less than or equal to the Nth smallest quality value of the quality value of each of the plurality of input symbols.

15. The Viterbi decoder according to claim 13 wherein the alternate input block calculator comprises an alternate input block calculator for producing up to $2^N-1$ possible alternate input blocks by complementing the Boolean value of each of the N selected symbols to produce N complemented symbols, and substituting Boolean combinations of the N complemented symbols for corresponding ones of the N selected symbols at corresponding stages.

16. A method in Viterbi decoder comprising:

selecting N input symbols in an input block to provide N selected symbols, wherein the input block has a plurality of input symbols, wherein each input symbol has a Boolean value, a quality value, and an associated stage, and wherein the N selected symbols are selected based on the quality value of each of the N selected symbols relative to the quality value of other input symbols in the input block;

complementing the Boolean values of the N selected symbols to produce N complemented symbols;

substituting one or more of the N complemented symbols for corresponding ones of the N selected symbols at corresponding stages to produce an alternate input block, wherein the one or more of the N complemented symbols comprises a Boolean combination of the N complemented symbols;

executing a Viterbi algorithm using the alternate input block to produce an alternate decoded bit sequence;

checking the alternate decoded bit sequence for errors using an error check; and outputting the alternate decoded bit sequence in response to the alternate decoded bit sequence passing the error check.

17. The method in Viterbi decoder according to claim 16 wherein the selecting N input symbols comprises selecting N input symbols from a plurality of input symbols produced with a rate one encoder.

18. The method in Viterbi decoder according to claim 16 wherein the checking the alternate decoded bit sequence for errors comprises checking the alternate decoded bit sequence for errors using a CRC type error check, wherein a CRC value computed on a first portion of the alternate decoded bit sequence is compared to a CRC value contained in a second portion of the alternate decoded bit sequence.

19. The method in Viterbi decoder according to claim 16 wherein the selecting N input symbols comprises selecting N input symbols in response to failing an error check of a decoded bit sequence corresponding to the plurality of input symbols.

20. The method in Viterbi decoder according to claim 16 wherein the N input symbols have N lowest quality values of a rank-ordered list of quality values of the plurality of input symbols.

* * * * *